United States Patent [19]
Kistner et al.

[11] Patent Number: 5,697,803
[45] Date of Patent: Dec. 16, 1997

[54] ZIF SOCKET WITH HOLD OPEN MECHANISM

[75] Inventors: Bernard Karl Kistner, Winston-Salem; Raymond Alfred Smith, Clemmons, both of N.C.

[73] Assignee: The Whitaker Corporation, Wilmington, Del.

[21] Appl. No.: 671,125

[22] Filed: Jun. 20, 1996

[51] Int. Cl.$^6$ ................................................. H01R 13/62
[52] U.S. Cl. ........................................ 439/342; 439/259
[58] Field of Search .......................... 439/342, 259–264, 439/266, 267, 268, 269, 341

[56] References Cited

U.S. PATENT DOCUMENTS

| | | | |
|---|---|---|---|
| 5,147,213 | 9/1992 | Funk et al. | 439/342 |
| 5,256,080 | 10/1993 | Bright | 439/342 |
| 5,370,549 | 12/1994 | Lee | 439/342 |
| 5,443,591 | 8/1995 | Tsai | 439/342 |
| 5,569,045 | 10/1996 | Hsu | 439/259 |

*Primary Examiner*—Hien Vu
*Attorney, Agent, or Firm*—Robert J. Kapalka

[57] ABSTRACT

A socket having a cover which is slidable on a base between open and closed positions has a detent mechanism comprising an interfitting ridge and groove which holds the cover in the open position.

3 Claims, 2 Drawing Sheets

ZIF SOCKET WITH HOLD OPEN MECHANISM

FIELD OF THE INVENTION

The invention relates to a zero insertion force socket which has a cover slidable on a base.

BACKGROUND OF THE INVENTION

U.S. Pat. No. 5,256,080 discloses a zero insertion force (ZIF) socket having a cover slidable on a base. The socket has a lever which is operably connected to a cam for moving the cover between an open position wherein leads of an electronic package are freely insertable in the socket, and a closed position wherein the leads encounter substantial resistance during insertion into, or extraction from, the socket.

The socket has a latch which interengages with an edge of the lever to retain the lever in a closed position corresponding to the closed position of the cover. The lever is essentially horizontal with respect to the socket when the lever is in the closed position. The latch can be overcome upon application of sufficient force to deflect the lever around the latch, wherein the lever is movable through an obtuse angle to an open position corresponding to the open position of the cover. Once the lever is moved beyond vertical, the lever is urged by gravity to remain in the open position.

Many ZIF sockets have a single lever arm which can only be pivoted through a right angle to a vertical orientation with respect to the socket. These levers are subject to accidentally falling down, in which case attempted insertion of an electronic package into the socket may lead to stubbing of the leads of the package or the contacts in the socket, thereby damaging one or both devices. Further, personnel that are not careful to fully open the lever may attempt insertion into the partially open socket, thereby encountering the same stubbing problem. The invention overcomes these problems by providing a means for securing the cover in the fully open position.

SUMMARY OF THE INVENTION

It is an object of the invention to secure a movable socket cover in an open position.

It is another object of the invention to provide a tactile indication of the open position of a zero insertion force socket.

It is yet another object of the invention to retain the lever upright on a zero insertion force socket.

It is still another object of the invention to reduce the stubbing of leads and contacts during insertion of an electronic package into a zero insertion force socket.

These and other objects are accomplished by a socket comprising a base, a cover slidable on the base between an open position wherein leads of an electrical device are freely insertable in the socket, and a closed position wherein the leads encounter resistance to insertion in the socket, and a detent mechanism for holding the cover in the open position. The detent mechanism preferably comprises the base and the cover having an interfitting ridge and groove. The cover may have a skirt which depends downwardly along a side of the base, with the interfitting ridge and groove being on respective opposite ones of the skirt and the side of the base.

BRIEF DESCRIPTION OF THE DRAWINGS

The invention will now be described by way of example with reference to the accompanying drawings wherein.

DETAILED DESCRIPTION OF THE PREFERRED EMBODIMENT

Figure 1:
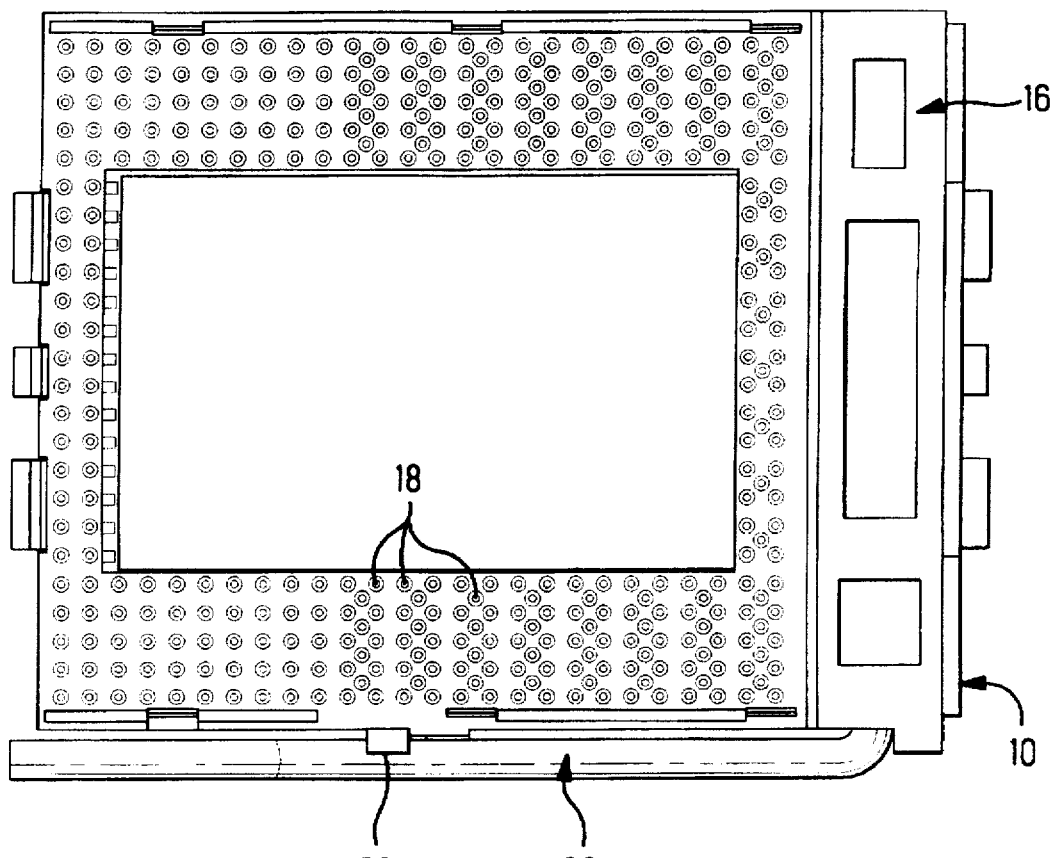
FIG. 1 is top plan view of a socket having a cover according to the invention.
Figure 2:
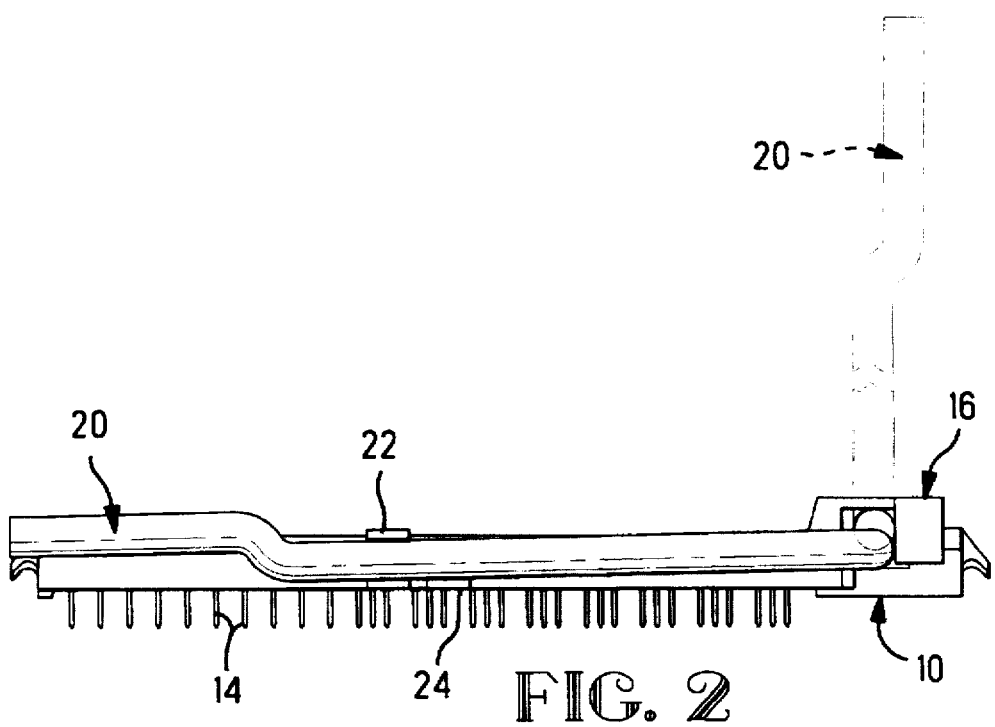
FIG. 2 is a side view of the socket.
Figure 3:
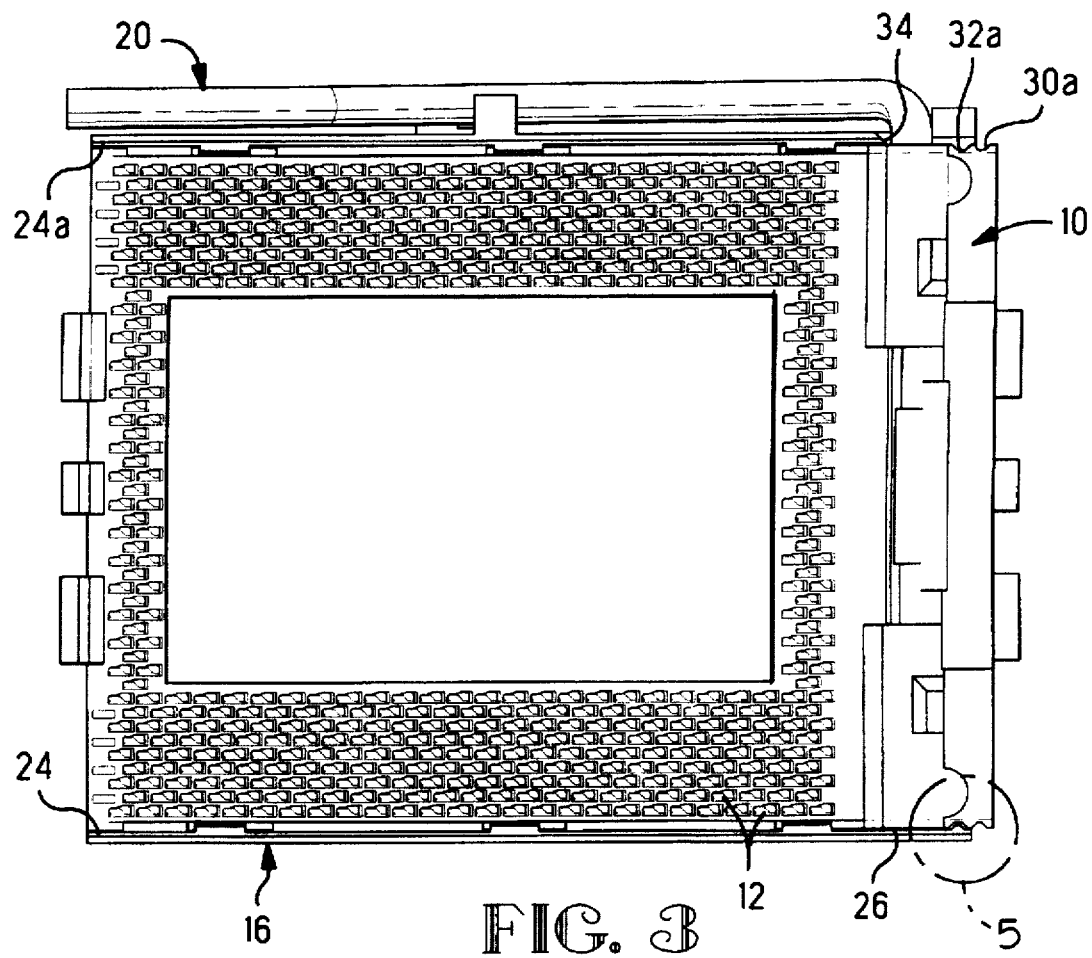
FIG. 3 is a bottom view of the socket showing a hold open mechanism for the cover within boundary line 5.

There is shown in FIGS. 1–3 a zero insertion force (ZIF) socket for a pin grid array (PGA) electronic package. Details of the construction and operation of such a socket are disclosed more fully in U.S. Pat. No. 5,256,080, which is incorporated by reference as if set forth fully herein.

The socket includes a base 10 holding a plurality of contacts in respective cavities 12. The contacts have circuit board engaging sections 14 for mating engagement with circuit traces on a circuit board. The cavities 12 are somewhat elongated, and each of the contacts has a deflectable contact arm disposed near one end of its respective cavity.

A cover 16 is slidable on the base 10 over a relatively small distance between open and closed positions. The cover has a plurality of holes 18 in registration with the cavities 12. An electronic package (not shown) having a plurality of pins, or leads, is matable with the socket by introducing the package onto the cover with the leads of the package projecting through the holes. When the cover is in the open position, the holes are aligned with respective cavity portions which are unobstructed by contact arms, whereby the leads enter the cavities against virtually no resistance. When the cover is moved to the closed position, the leads are moved to resiliently deflect their respective contact arms, thereby establishing electrical connections between the electronic package and the socket.

An actuator assembly includes a lever 20 which is operably connected for rotating a cam housed within the socket between the base and the cover. Operation of the lever 20 causes the cover 16 to slide along the base 10. The lever 20 has open and closed positions corresponding to the open and closed positions of the cover 16. When open, the lever stands upright in a vertical orientation with respect to the socket as shown in phantom in FIG. 2, and when closed, the lever resides horizontally along a side of the socket. The cover has a latch 22 in the form of a projecting tab for holding the lever 20, and thus the cover, in the closed position. The latch can be overcome by applying a sufficient force to resiliently deflect the lever around the latch.

According to the invention, a hold open mechanism is provided for holding the cover in the open position. In a preferred embodiment, the hold open mechanism is provided by a detent mechanism wherein an interfitting ridge and groove are provided on opposite ones of the base and the cover.

Figure 4:
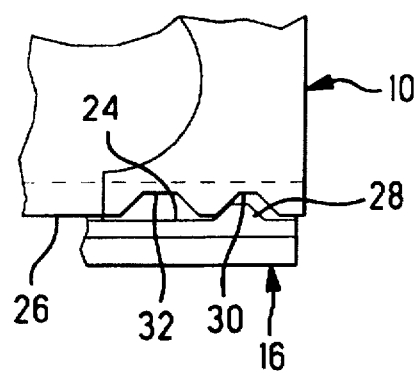
FIG. 4 is an enlarged view of the socket portion within boundary line 5 in FIG. 3 showing the hold open mechanism when the cover is in the open position.
Figure 5:
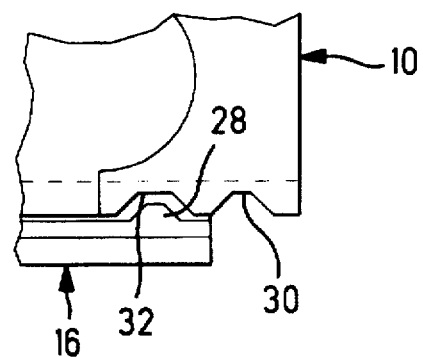
FIG. 5 is an enlarged view similar to FIG. 4 showing the hold open mechanism when the cover is in the closed position.

Referring now to FIGS. 3–5, the cover has a downwardly depending skirt 24 which is closely adjacent to a side 26 of the base. A ridge 28 on the skirt cooperates with a groove 30 in the base to provide the detent mechanism which holds the cover in the open position shown in FIG. 4. The skirt is relatively thin and resilient. When a force is applied to rotate the lever 20 downwardly from the vertical open position, the cover is moved and the ridge 28 is deflected out of the groove 30. An adjacent groove 32 in the base receives the ridge 28 when the cover is closed, as shown in FIG. 5, so that the skirt is not in a constant state of deflection. The ridge 28 and the grooves 30, 32 each have beveled sides so that the ridge does not interlock in either one of the grooves.

As shown in FIG. 3, the interfitting ridge 28 and groove 30 are on a side of the socket opposite from the lever 20 due to the fact that corresponding skirt 24a on the lever side of the socket has a cutout 34 to permit the lever to extend into the socket for connection with the cam. Since it is desirable to produce the socket in both right and left-hand lever versions, the base may have a corresponding set of grooves 30a, 32a on a side opposite from the grooves 30, 32. Such a base could receive either a right or left-hand lever and a corresponding cover having a ridge disposed for cooperation with the appropriate set of grooves.

The invention provides a detent mechanism for holding the movable cover of a socket in an open position. The detent mechanism prevents inadvertent downward rotation of an operating lever such may be caused by gravity or accidental jarring of the socket. The detent mechanism also provides a tactile indication that the lever is in the fully open position.

The invention having been disclosed, a number of variations will now become apparent to those skilled in the art. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

We claim:

1. A socket comprising:

a base;

a cover slidable on the base between an open position wherein leads of an electrical device are freely insertable in the socket, and a closed position wherein the leads encounter resistance to insertion in the socket;

a lever operably connected to a cam and movable from a lower position to an upper position for sliding the cover on the base; and a detent mechanism for holding the cover in the open position, wherein the detent mechanism comprises the base and the cover having an interfitting ridge and groove.

2. The socket according to claim 1, wherein the cover has a skirt which depends downwardly along a side of the base, and the interfitting ridge and groove are on respective opposite ones of the skirt and the side of the base.

3. The socket according to claim 1, further comprising an adjacent groove which receives the ridge when the cover is in the closed position.

* * * * *